(12) United States Patent
Chun (10) Patent No.: US 8,216,746 B2
(45) Date of Patent: Jul. 10, 2012

(54) METHOD OF CORRECTING DEFECT IN EUV MASK

(75) Inventor: Jun Chun, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 182 days.

(21) Appl. No.: 12/837,855

(22) Filed: Jul. 16, 2010

(65) Prior Publication Data

US 2011/0159412 A1 Jun. 30, 2011

(30) Foreign Application Priority Data

Dec. 28, 2009 (KR) ........................ 10-2009-0132248

(51) Int. Cl.
*G03F 1/24* (2012.01)
*G03F 1/72* (2012.01)
*G01Q 60/42* (2010.01)

(52) U.S. Cl. ............................ 430/5; 850/42
(58) Field of Classification Search ......... 430/5; 850/42
See application file for complete search history.

(56) References Cited

U.S. PATENT DOCUMENTS

| 6,908,713 | B2 | 6/2005 | Silverman |
| 7,375,352 | B2 | 5/2008 | Takaoka et al. |
| 2003/0006214 | A1 | 1/2003 | Stearns et al. |
| 2003/0207184 | A1 | 11/2003 | Smith |
| 2003/0233870 | A1* | 12/2003 | Mancevski ............ 850/37 |
| 2008/0131792 | A1 | 6/2008 | Takaoka et al. |

FOREIGN PATENT DOCUMENTS

| JP | 2005-260056 A | 9/2005 |
| KR | 1020070054019 A | 5/2007 |

* cited by examiner

*Primary Examiner* — Mark F Huff
*Assistant Examiner* — John S Ruggles
(74) *Attorney, Agent, or Firm* — Ladas & Parry LLP (57) ABSTRACT

Provided is a method of correcting a defect in an extreme ultraviolet (EUV) mask. A monomolecular film is chemically bonded onto a surface of a repair tip. The repair tip is positioned over a defect disposed on the EUV mask, so that the monomolecular film bonded onto the repair tip can also bond to the defect. The repair tip is then moved away from the EUV mask so that the defect is separated from the EUV mask and thus removing the defect in the EUV mask.

21 Claims, 9 Drawing Sheets

METHOD OF CORRECTING DEFECT IN EUV MASK

CROSS-REFERENCES TO RELATED APPLICATIONS

The present application claims priority under 35 U.S.C 119(a) to Korean application number 10-2009-0132248, filed on Dec. 28, 2009, in the Korean intellectual property Office, which is incorporated herein by reference in its entirety set forth in full.

BACKGROUND

Exemplary embodiments of the present invention relate to a method of correcting a defect in a mask used in a semiconductor device fabrication, and more particularly, to a method of correcting a defect in an extreme ultraviolet (EUV) mask.

As the integration density of semiconductor devices has increased in recent years, optical lithography has reached the limit. Small images have been transferred on a wafer by using resolution enhancement technologies, such as an optical proximity correction (OPC), a phase shift mask, an off-axis illumination, and so on. However, as semiconductor devices have become much finer, these technologies have reached the physical limit. Accordingly, much attention has been paid to a lithography which can transfer smaller images on a wafer. Immersion lithography has recently been proposed which increases a resolution by using a liquid medium having a higher refractive index than air. In addition, much research has been conducted on next generation lithography technologies which can ensure finer resolutions.

Representative examples of the next generation lithography technologies include an extreme ultraviolet lithography (EUVL), an electron projection lithography (EPL), a proximity electron-beam lithography (PEL), a proximity X-ray lithography (PXL), and so on. The EUVL is designed to use a wavelength of approximately 13.5 nm. Light having the wavelength of approximately 13.5 nm, however, is absorbed by most materials, including air. Thus, the EUVL uses reflective masks and reflective optical systems, instead of transmissive masks and transmissive optical systems.

Figure 1:
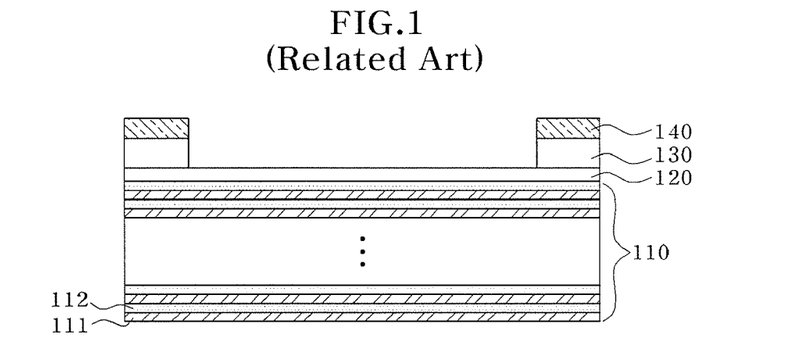
FIG. 1 is a cross-sectional view schematically illustrating a sectional structure of an EUV mask used in a typical EUVL.

FIG. 1 is a cross-sectional view schematically illustrating a sectional structure of an EUV mask used in a typical EUVL. Referring to FIG. 1, a multilayer reflection film 110 is disposed over a substrate (not shown). The multilayer reflection film 110 is formed by sequentially stacking materials 111 and 112 having different optical properties, and uses a constructive interference (Bragg reflection) of a partial reflection which occurs at the interface of the materials 111 and 112. The reflectivity of the multilayer reflection film 110 is proportional to the square of the difference between the refractive indexes (real parts of complex refractive indexes) of the two materials 111 and 112 which are alternately stacked. In addition, the wavelength and maximum reflectivity of the reflected extreme ultraviolet light are determined by the kinds of the materials 111 and 112. For example, when the multilayer reflection layer 110 has a structure in which molybdenum (Mo) 111 and silicon (Si) 112 are alternately stacked, its maximum reflectivity ranges from approximately 60% to approximately 75%. A capping layer 120 is disposed over the multilayer reflection film 110 and protects the multilayer reflection film 110. As one example, the capping layer 120 may include a silicon oxide ($SiO_2$) film or a silicon (Si) film. A pattern structure in which a buffer pattern 130 and an absorption pattern 140 are sequentially stacked is disposed over the capping layer 120. As one example, the buffer pattern 130 may include a silicon oxide ($SiO_2$) film, and the absorption pattern 140 may include a tantalum (Ta)-based absorber, such as a tantalum nitride (TaN) film, or a chromium (Cr)-based absorber.

When the lithography is performed using the EUV mask, an important issue is whether or not there is a defect in the multilayer reflection film 110. When there is a defect in the multilayer reflection film 110, the defect causes the variation in the intensity of a reflected light, resulting in a defective device. The defect of the multilayer reflection film 110 may be caused during the deposition of the multilayer reflection film 110, or may be caused by a defect of the capping layer 120. The defect of the capping layer 120 may be residual materials remaining on the surface of the capping layer 120 after an etching process is performed for forming the capping layer 120, or may be a defect of the capping layer 120 in itself. Thus, the defect of the capping layer 120 must be removed.

Generally, the defect of the capping layer 120 may be removed by a method using e-beam, focused ion beam (FIB), or atomic force microscope (AFM). However, since the method using e-beam or focused ion beam (FIB) utilizes equipments which use high energy, it is highly likely to cause another defect in the capping layer 120. Also, the method using atomic force microscope (AFM) is highly likely to cause another defect in the capping layer 120 because of its physical scratch operation. Moreover, as patterns have become fine below a certain size, for example, 20 nm or less, slight defects having been neglected must also be removed.

However, it is difficult to apply the existing methods due to their low resolution.

SUMMARY

An embodiment of the present invention relates to a method of correcting a defect in an extreme ultraviolet (EUV) mask, which is capable of removing a defect on a capping layer in fine units, without substantially causing another defect on the capping layer which protects a multilayer reflection film of the EUV mask.

In one embodiment, a method of correcting a defect in an EUV mask includes: preparing a repair tip on the surface of which a monomolecular film is bonded; positioning the repair tip over a defect disposed on the EUV mask, so that the monomolecular film bonded with the repair tip is bonded with the defect; and moving the repair tip in a direction away from the EUV mask, so that the defect is separated from the EUV mask.

The repair tip may include an atomic force microscope (AFM) tip.

An end portion of the repair tip may have a curvature diameter of approximately 30 nm or less. Specifically, the end portion of the repair tip may have the curvature diameter of approximately 20 nm.

The repair tip may be made of silicon (Si).

The preparing of the repair tip on the surface of which the monomolecular film is bonded may include: forming an oxide film on the surface of the repair tip; and immersing the repair tip, where the oxide film is formed, in a solution, where a monomolecule is dissolved, for a predetermined time.

The monomolecular film may include a silane-based monomolecule film having at least one carbon-silicon bond structure. In this case, the silane-based monomolecular film may have a structure in which a first functional group and a second function group are bonded with silicon (Si), the first functional group reacting with the surface of the repair tip to form a self-assembled film, the second function group reacting with the defect to form a self-assembled film. The second functional group may include methoxy (OCH3).

The defect on the EUV mask may be residual material that remains on the surface of the capping layer after an etching process is performed for forming a buffer pattern. In this case, the residual material may include a silicon oxide film. The bonding of the defect and the monomolecular film bonded with the repair tip may include bonding silicon (Si) of the silicon oxide film and oxygen (O) of the monomolecular film bonded with the repair tip.

The defect on the EUV mask may also include a protrusion which abnormally protrudes from the surface of the capping layer. In this case, the capping layer may be made of silicon (Si). The bonding of the defect and the monomolecular film bonded with the repair tip may include bonding oxygen (O) of the monomolecular film, which is bonded with the repair tip, and silicon (Si) of a natural oxide film, which is formed on the protrusion which abnormally protrudes from the surface of the capping layer.

When the defect remains after the process of separating the defect from the EUV mask, the defect bonded with the repair tip may be removed, and the defect removal process may be repeated.

In another embodiment, in an EUV mask where a multi-layer reflection film, a capping layer, a buffer pattern, and an absorption pattern are stacked on a substrate, a method of correcting a defect in the EUV mask to remove a buffer pattern residual material disposed on the capping layer includes: preparing a repair tip on the surface of which a monomolecular film is bonded; positioning the repair tip over the buffer pattern residual material disposed on the EUV mask, so that the monomolecular film bonded with the repair tip is bonded with the buffer pattern residual material; and moving the repair tip in a direction away from the EUV mask, so that the buffer pattern residual material is separated from the EUV mask.

The repair tip may be made of silicon (Si), and the monomolecular film may include a silane-based monomolecule having at least one carbon-silicon bond structure. The buffer pattern residual material may include a silicon oxide film.

In another embodiment, in an EUV mask where a multi-layer reflection film, a capping layer, a buffer pattern, and an absorption pattern are stacked on a substrate, a method of correcting a defect in the EUV mask to remove a protrusion formed on the capping layer includes: preparing a repair tip on the surface of which a monomolecular film is bonded; performing a first process of positioning the repair tip over a defect disposed on the EUV mask, so that the monomolecular film bonded with the repair tip is bonded with a natural oxide film disposed on the protrusion; performing a second process of moving the repair tip in a direction away from the EUV mask, so that the natural oxide film is separated from the EUV mask; and completely removing the protrusion by repeating the process of removing the separated natural oxide film, which is bonded with the repair tip, from the repair tip, the first process, and the second process.

The method may further include forming a natural oxide film by exposing the protrusion to the atmosphere after the second process.

The repair tip may be made of silicon (Si), and the monomolecular film may include a silane-based monomolecule having at least one carbon-silicon bond structure. The protrusion of the capping layer may be made of silicon (Si).

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Figure 2:
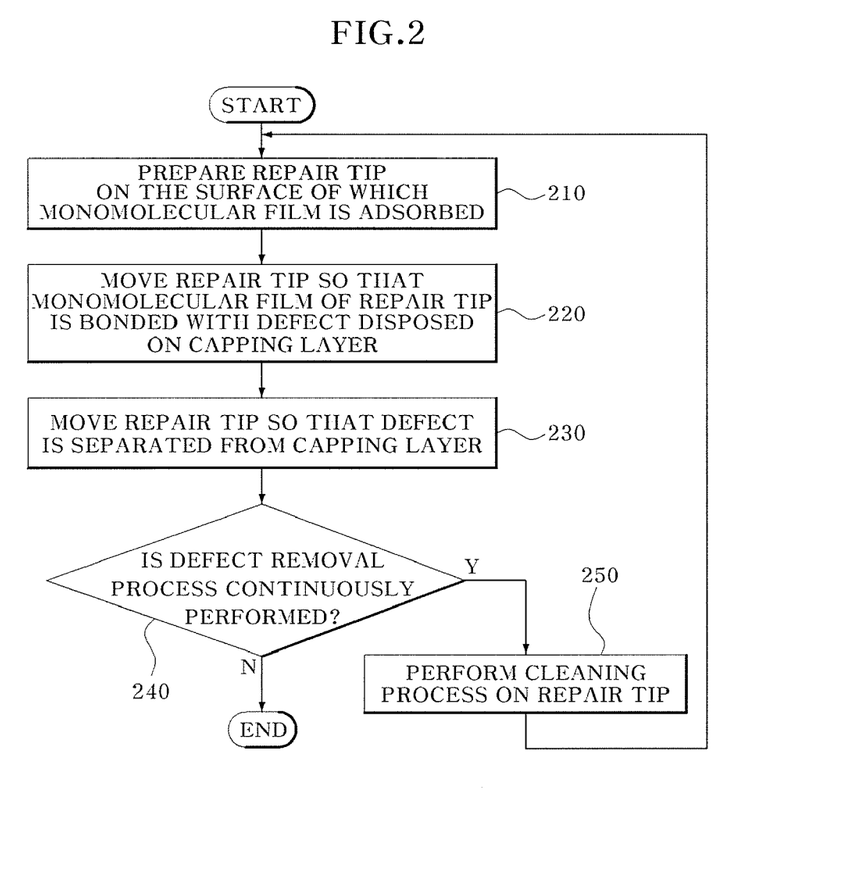
FIG. 2 is a flowchart illustrating some of the important steps in a method of correcting a defect in an EUV mask according to an embodiment of the present invention.

FIG. 2 is a flowchart illustrating a method of correcting a defect in an EUV mask according to an embodiment of the present invention. Referring to FIG. 2, a repair tip on the surface of which a monomolecular film is bonded is prepared at step 210. At step 220, the repair tip is positioned over a defect on a capping layer and moved to approach the defect so that the monomolecular film of the repair tip is bonded with the defect disposed on the capping layer. The term "bond" refers to a chemical bond between a component of the monomolecular film and a component of the defect. This chemical bond refers to a chemical bond in which a bond strength between the defect and the monomolecular film is greater than a bond strength between the defect and the capping layer. For example, the chemical bond may be a covalent bond. At step 230, the repair tip is moved away from the capping layer, so that the defect chemically bonded with the monomolecular film of the repair tip is separated from the capping layer. At step 240, it is determined whether to continuously perform the defect removal process. At step 250, when it is determined to continuously perform the defect removal process, that is, when a defect to be removed remains, the monomolecular film and the defect which are bonded with the repair tip are removed by using a cleaning process or the like. Then, the steps 210 to 250 are repeated. In some cases, only the defect may be removed while the monomolecular film is left in the repair tip. In these cases, the steps 220 to 250 are repeated.

FIGS. 3 to 8 are views illustrating depicting some of the important steps in the respective steps of the flowchart of FIG. 2 in more detail.

Figure 3:
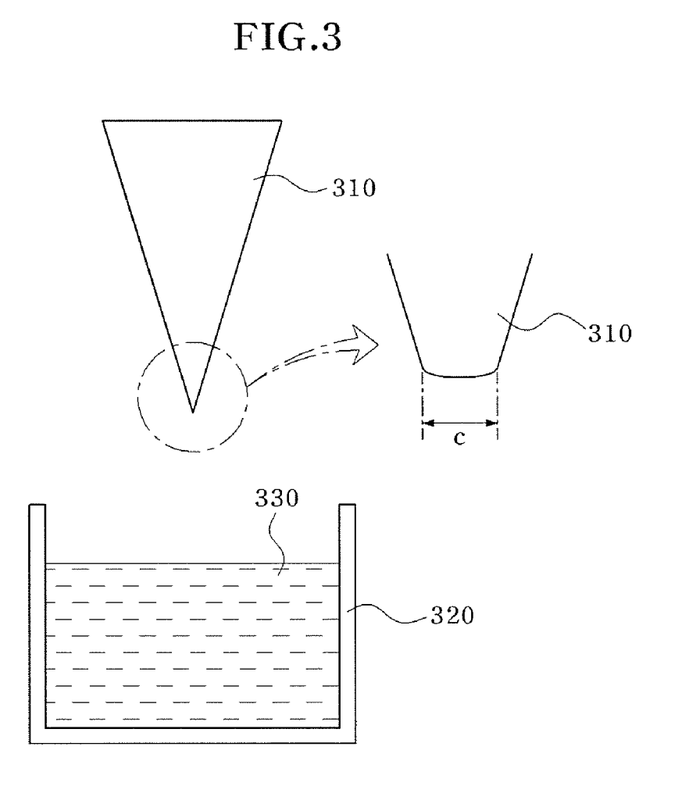
FIGS. 3 to 8 are views depicting some of the important steps in a method of correcting a defect in an EUV mask according to an embodiment of the present invention.

FIG. 3 is a view depicting the step 210 of preparing the repair tip on the surface in which the monomolecular film is bonded thereon. A repair tip 310 and a container 320 are prepared. The container 320 contains a solution 330 in which monomolecules are dissolved. There is no limitation on the kind of the repair tip 310. For example, an AFM tip may be used. The curvature diameter c of the end portion of the repair tip 310 is approximately 30 nm or less, specifically approximately 20 nm, so that the defect having a size of at least approximately 20 nm can be removed. Various kinds and types of different monomolecular films may be used in accordance to a molecular structure of the particular defect needed to be removed. The repair tip 310 may be made of silicon (Si) because a natural oxide film is easily formed thereon. That is, a natural oxide film is formed thinly on the surface of the silicon repair tip 310 in the atmosphere. The natural oxide film on the surface of the repair tip 310 reacts with silane-based monomolecules which are monomeric silicon chemicals, and a self-assembled film is formed on the surface of the repair tip 310. The monomolecules dissolved in the solution 330 are silane-based monomolecules having at least one carbon-silicon bond structure, but they are not limited thereto. As one example, the monomolecules may be other kinds of monomolecules which can result in a self-assembled film to be formed by the reaction with the natural oxide film disposed on the surface of the repair tip 310. When the repair tip 310 is made of a material other than silicon (Si), it is apparent that it is possible to use monomolecules capable of causing the self-assembled film to be formed by the reaction with the material constituting the surface of the repair tip 310. In some cases, even though the repair tip 310 is made of a material other than silicon (Si), a thin oxide film may be formed in order for reaction with the silane-based monomolecules by performing an oxidation process on the surface of the repair tip 310.

Figure 4:
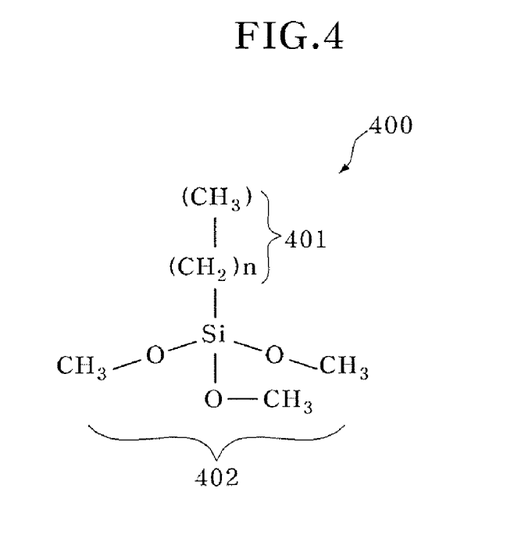

FIG. 4 illustrates an example of a structural formula of a silane-based monomolecule. As illustrated in FIG. 4, the silane-based monomolecule 400 includes silicon (Si), and has a structure in which a first functional group 401 and a second functional group 402 are bonded to silicon (Si). The first functional group 401 reacts with the natural oxide film disposed on the surface of the repair tip 310 to form the self-assembled film. The second functional group 402 reacts with the target defect to form the self-assembled film. In this example, the second functional group 402 includes the methoxy ($OCH_3$) functional group because the defect to be removed is an oxide film. When the defect to be removed is made of a material other than oxide, the second functional group may include a functional group other than methoxy. As such, when the repair tip 310 is immersed in the solution 330 in which the silane-based monomolecule is dissolved, silicon (Si) of the repair tip 310 and the first functional group 401 of the silane-based monomolecule react with each other to form the self-assembled film. Consequently, the silane-based monomolecule is bonded on the surface of the repair tip 310.

Figure 5:
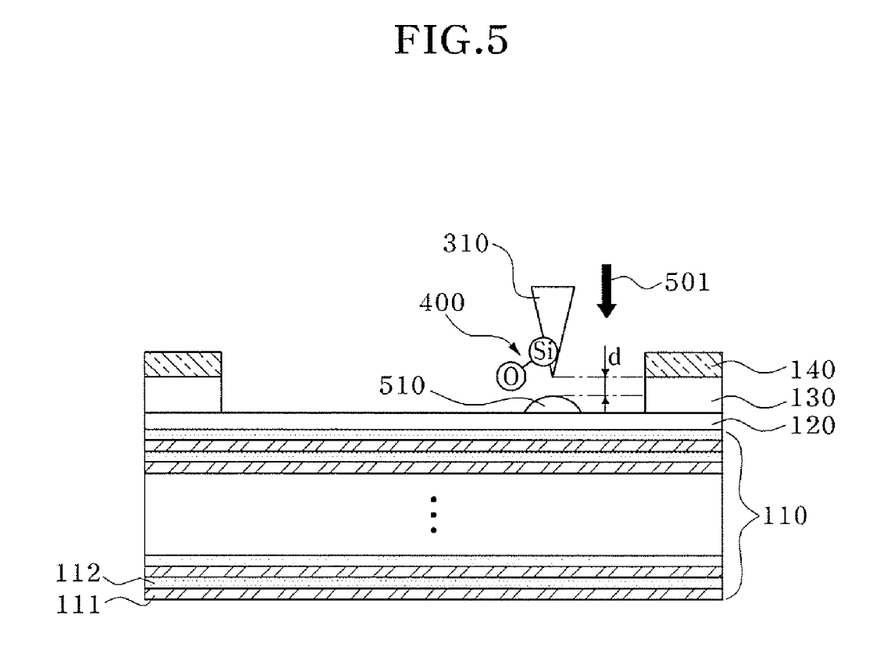

FIG. 5 is a cross-sectional view explaining the step 220 of moving the repair tip, so that the monomolecular film of the repair tip is bonded with the defect disposed on the surface of the capping layer. As illustrated in FIG. 5, the repair tip 310 with which the monomolecular film 400 is bonded is positioned over the defect 510 to be removed. In this example, the defect 510 to be removed is residual material remaining on the surface of the capping layer 120 after an etching process is performed for forming the buffer pattern 130. The defect 510 to be removed is made of the same material as the buffer pattern 130, for example, a silicon oxide film. As indicated by an arrow 501 in FIG. 5, the repair tip 310 is moved downward to approach the defect 510. The distance d between the defect 510 and the repair tip 310 is adjusted so that the monomolecular film 400 bonded with the repair tip 310 can react with the defect 510, without direct contact therebetween. As one example, the distance d between the defect 510 and the repair tip 310 is several nanometers or less. Since the repair tip 310 does not contact the surface of the capping layer 120 during the defect removal process, the surface of the capping layer 120 is not damaged by the repair tip 310.

Figure 6:
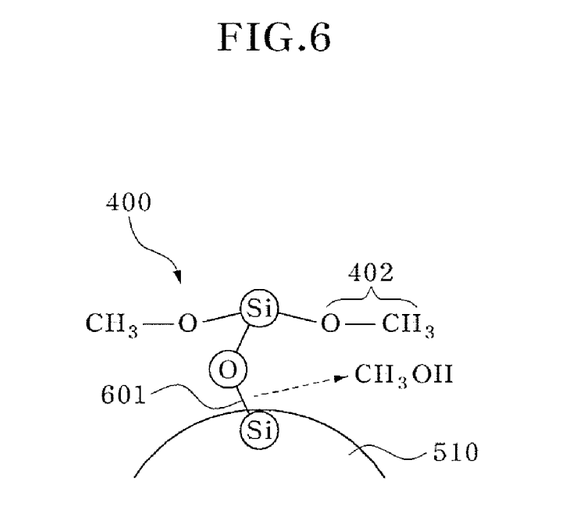

FIG. 6 is a view explaining the chemical reaction between the monomolecular film 400 bonded with the repair tip 310 and the defect made of the silicon oxide film. Referring to FIG. 4, the monomolecular film 400 has a structure in which the first functional group (401 in FIG. 4) and the second functional group (402 in FIG. 4) are bonded on both sides of silicon (Si). The first functional group (401 in FIG. 4) is already bonded with the repair tip 310. Due to this bond, the bond state of the monomolecular film 400 and the repair tip 310 is maintained. The second functional group (402 in FIG. 4) reacts with the defect 510. Specifically, as illustrated in FIG. 6, oxygen (O) of the second functional group 402 and silicon (Si) of the defect 510 react with each other to form the bond 601 therebetween, and methanol ($CH_3OH$) is generated as a by-product. In this case, the bond between oxygen (O) of the second functional group 402 and silicon (Si) of the defect 510 is a covalent bond.

Figure 7:
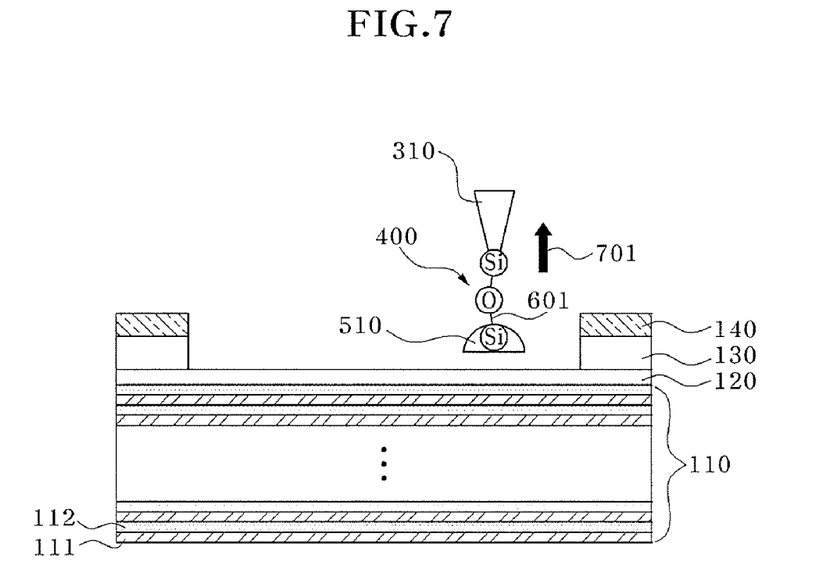
Figure 8:
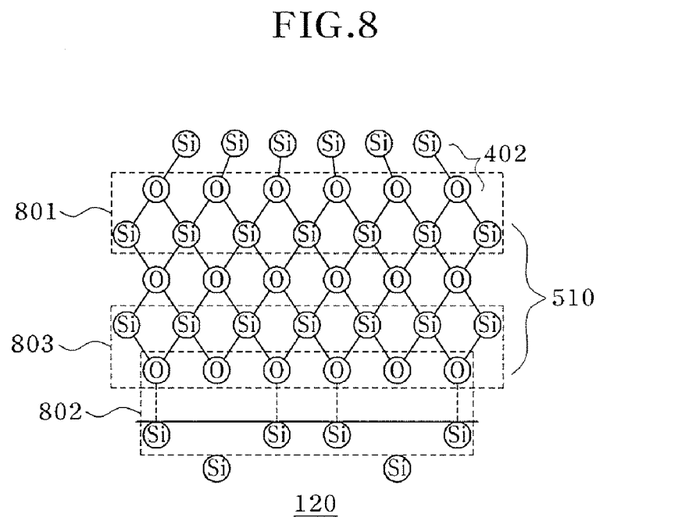
Figure 9:
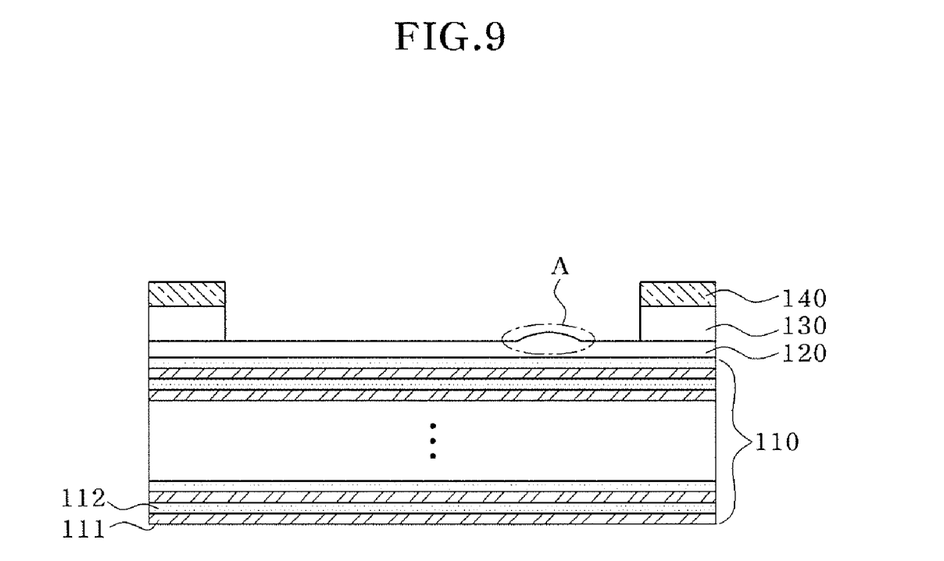
FIGS. 9 to 14 are views depicting some of the important steps in a method of correcting a defect in an EUV mask according to another embodiment of the present invention.

FIGS. 7 and 8 are views explaining the step 230 of moving the repair tip 310 so that the defect 510 is separated from the capping layer 120. As illustrated in FIG. 7, when the repair tip 310 is moved in a direction of an arrow 701, that is, in a direction away from the capping layer 120 in such a state that oxygen (O) of the monomolecular film 400 and silicon (Si) of the defect 510 are bonded together, the defect 510 is pulled in the direction of the arrow 701 by the monomolecular film 400 bonded with the repair tip 310. Consequently, the defect 510 is separated and removed away from the capping layer 120.

This process will be described below in more detail with reference to FIG. 8. Since the capping layer 120 is the silicon (Si) film, it is made in a silicon atom structure. Since the defect 510 to be removed is the silicon oxide ($SiO_2$) film, silicon (Si) and oxygen (O) are bonded in a chain structure. When the repair tip 310 with which the monomolecular film 400 is bonded approaches the defect 510, oxygen (O) of the second functional group of the monomolecular film 400 is covalently bonded with silicon (Si) of the defect 510. In such a state, when the repair tip 310 is moved in a direction away from the capping layer 120, the defect 510 is pulled by the monomolecular film 400. Consequently, the defect 510 is separated from the capping layer 120. Specifically, silicon (Si) and oxygen (O) at the interface between the capping layer 120 and the defect 510 are bonded together in an unstable state. Hence, the bond number of silicon (Si) and oxygen (O) per unit area at the interface (see 802) is smaller than the bond number of silicon (Si) and oxygen (O) per unit area within the defect 510 (see 803), and the bond number of silicon (Si) of the second functional group 402 and oxygen (O) of the defect 510 per unit area (see 801). Therefore, as a whole, the bond strength of silicon (Si) and oxygen (O) within the defect 510 is greater than the bond strength of silicon (Si) and oxygen (O) between the capping layer 120 and the defect 510. Likewise, the bond strength of silicon (Si) of the second functional group 402 and oxygen (O) of the defect 510 acts greater than the bond strength of silicon (Si) and oxygen (O) between the capping layer 120 and the defect 510. Hence, the bond 802 between the defect 510 and the capping layer 120 is broken earlier than the bond between the defect 510 and the monomolecular film 400 and the bond between the second functional group 402 and the defect 510. Consequently, the defect 510 is separated from the capping layer 120. In some cases, the bond 803 of silicon (Si) and oxygen (O) within the defect 510 may be broken earlier than the others, depending on film quality of the silicon oxide film constituting the defect 510. In this case, only a portion of the defect 510 is removed. Therefore, in this case, the steps described above with reference to FIGS. 3 to 8 are repeated until the defect 510 is completely removed from the capping layer 120.

Figure 10:
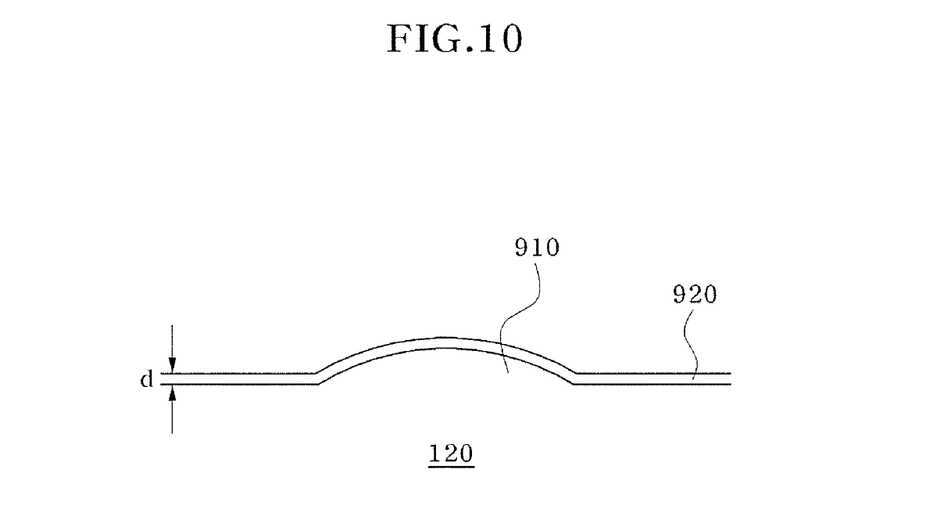

FIGS. 9 to 14 are views depicting some of the more important steps in a method of removing a defect from a capping layer according to another embodiment of the present invention. In this embodiment, a defect to be removed is a defect of a capping layer in itself. For example, as indicated by a portion "A" of FIG. 9, the defect to be removed is a protrusion which protrudes from the surface of the capping layer 120. When the surface of the capping layer 120 is not flat, an error may occur in a reflection operation. Since the protrusion acts as a defect to degrade the surface flatness of the capping layer 120, it must be removed. FIG. 10 is a view illustrating the portion "A" of FIG. 9. As illustrated in FIG. 10, since the capping layer 120 is made of silicon (Si), a natural oxide film 920 is formed on the surface of the capping layer 120 in the atmosphere. The natural oxide film 920 is formed by the reaction between oxygen (O) of the atmosphere and silicon (Si) of the capping layer 120. Thus, as the natural oxide film 920 is formed, the surface of the capping layer 120 is partially removed. Such a phenomenon is used in this embodiment. When the natural oxide film 920 on the surface of the defect 910 is removed, a natural oxide film is re-formed on the surface of the defect 910. During this process, the upper portion of the defect 910 is oxidized by a predetermined thickness, and the oxidized portion is removed by the removal of the natural oxide film.

Figure 11:
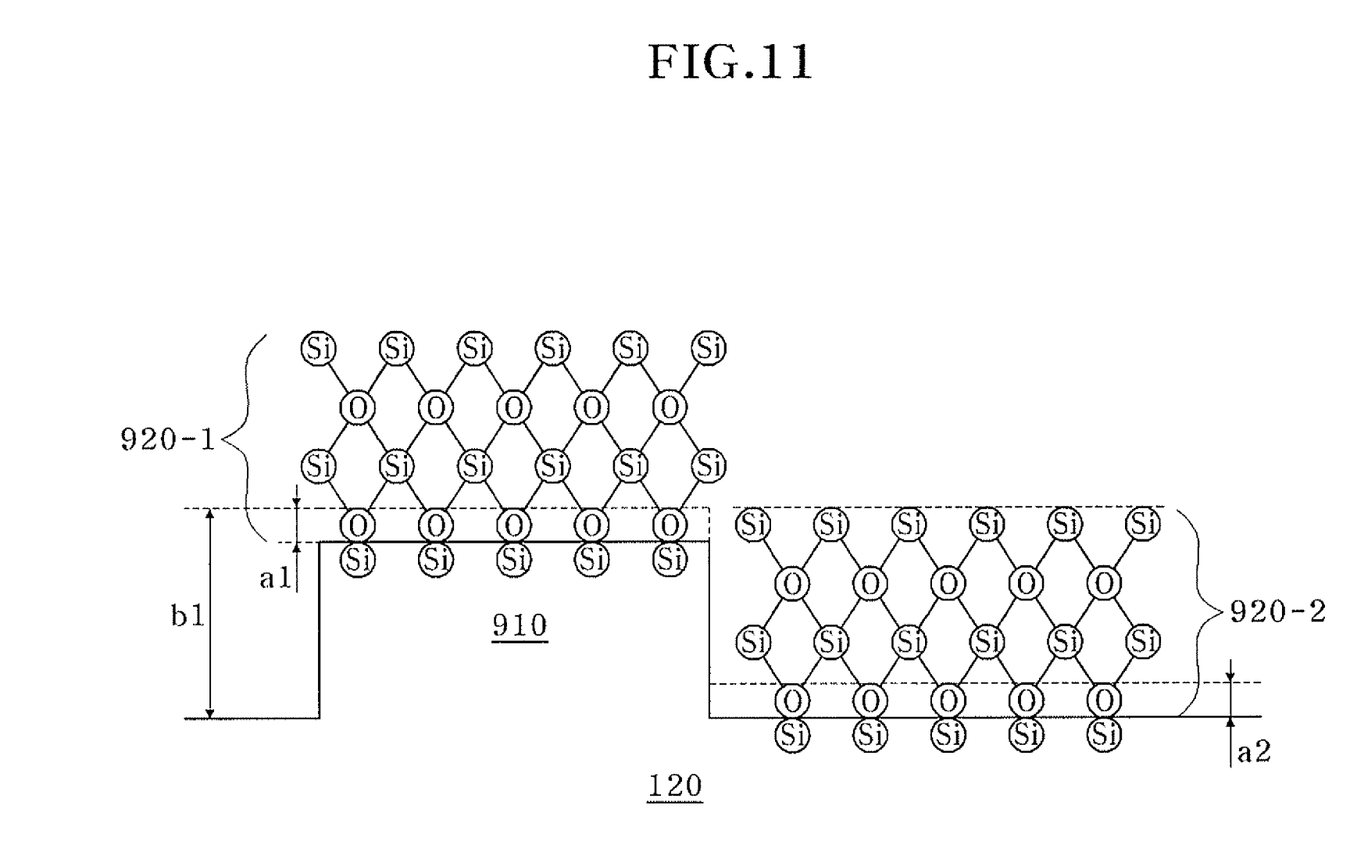

Specifically, as illustrated in FIG. 11, natural oxide films 920-1 and 920-2 are formed over the capping layer 120 having the protruding defect 910. In this embodiment, for convenience, the natural oxide film formed on the defect 910 is referred to as a first natural oxide film 920-1, and the natural oxide film formed on the capping layer 120 is referred to as a second oxide film 920-2. As the first natural oxide film 920-1 is formed, the upper portion of the defect 910 is oxidized by a predetermined thickness a1. Likewise, as the second natural oxide film 920-2 is formed, the upper portion of the capping layer 120 is oxidized by a predetermined thickness a2. That is, the thickness of the defect 910 is reduced by the oxidized thickness a1 from the initial thickness b1. The oxidized thickness a1 on the upper portion of the defect 910 and the oxidized thickness a2 on the upper portion of the capping layer 120 are substantially equal to each other, but may be slightly different form each other. In this manner, only the first natural oxide film 920-1 on the upper portion of the defect 910 is removed by using the monomolecular film in such a state that the first natural oxide film 920-1 and the second natural oxide film 920-2 are formed.

To this end, as described above with reference to FIGS. 3 and 4, the repair tip 310 on the surface of which the monomolecular film 400 is bonded is prepared. Since the target to be removed is the natural oxide film, that is, the silicon oxide film, the AFM tip made of silicon (Si) may be used as the repair tip 310. A silane-based monomolecule having at least one carbon-silicon bond structure is used as the monomolecule of the monomolecular film 400. As such, after the repair tip 310 with which the monomolecular film 400 is bonded is prepared, the repair tip 310 is aligned over the defect 910 and moved downward to approach the defect 910. At this time, the repair tip 310 approaches the surface of the first natural oxide film 920-1 to the extent that it can react with the first natural oxide film 920-1 of the defect 910.

Figure 12:
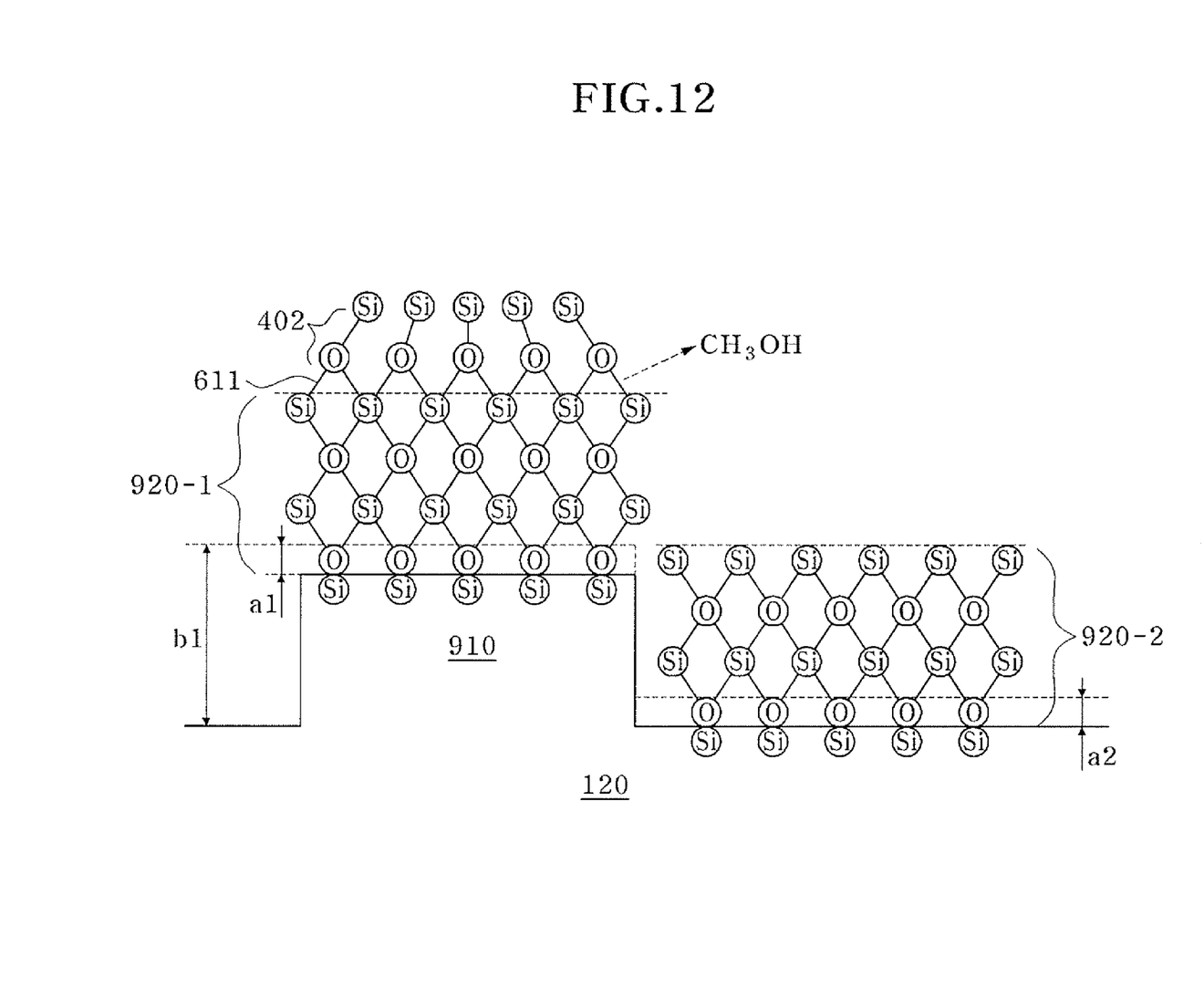

FIG. 12 is a view explaining the reaction between the monomolecular film 400 bonded with the repair tip 310 and the first natural oxide film 920-1 disposed on the defect 910. Referring to FIG. 12, the monomolecular film 400 has a structure in which the first functional group (401 in FIG. 4) and the second functional group (402 in FIG. 4) are bonded on both sides of silicon (Si). The first functional group (401 in FIG. 4) is already bonded with the repair tip 310. Due to this bond, the bond state of the monomolecular film 400 and the repair tip 310 is maintained. The second functional group (402 in FIG. 4) reacts with the first natural oxide film 920-1. Specifically, oxygen (O) of the second functional group 402 and silicon (Si) of the first natural oxide film 920-1 react with each other to form the bond 611 therebetween, and methanol ($CH_3OH$) is generated as a by-product. The bond 611 between oxygen (O) of the second functional group 402 and silicon (Si) of the first natural oxide film 920-1 is a covalent bond.

Figure 13:
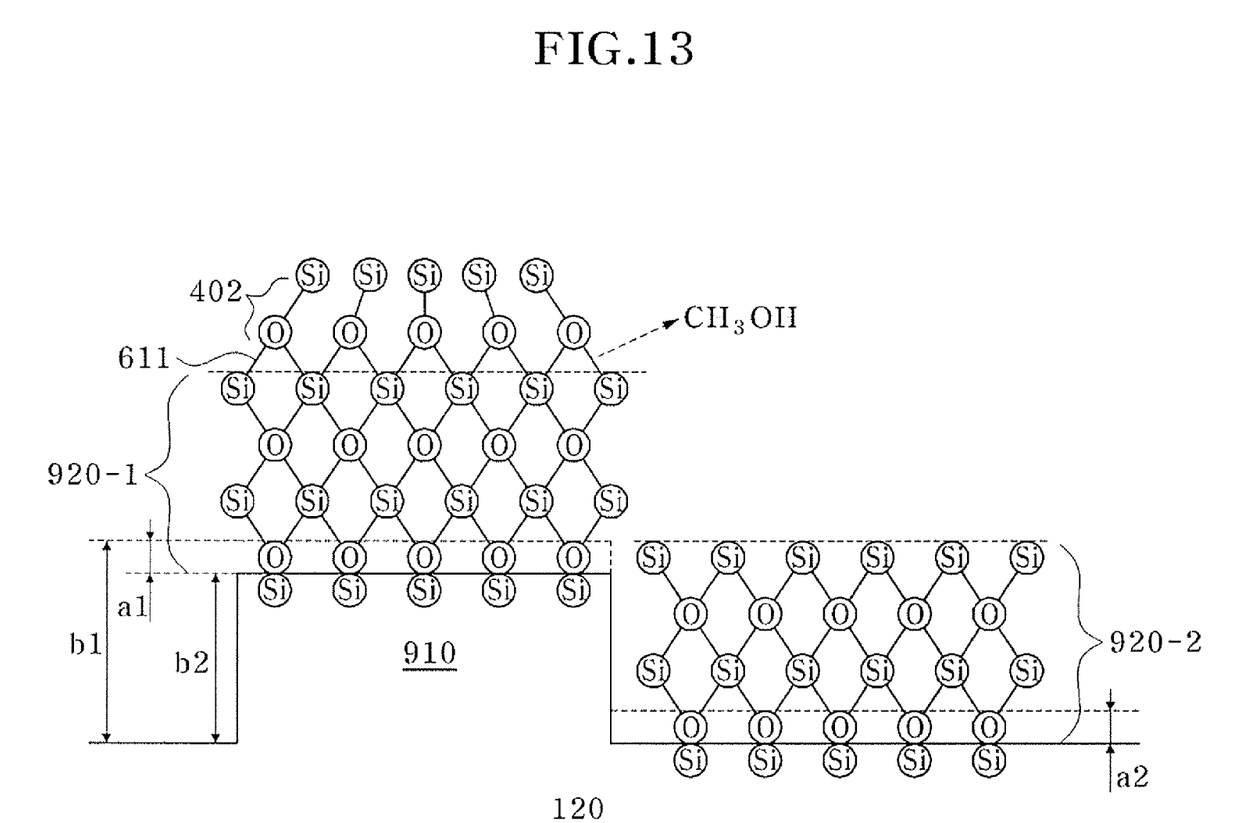

In such a state, when the repair tip 310 is moved away from the first natural oxide film 920-1, the first natural oxide film 920-1 is pulled by the monomolecular film 400. As a result, as illustrated in FIG. 13, the first natural oxide film 920-1 on the defect 910 is removed. As the first natural oxide film 920-1 is removed, the defect 910 has a thickness b2 which is reduced by the oxidized thickness a1 from the initial thickness b1.

Figure 14:
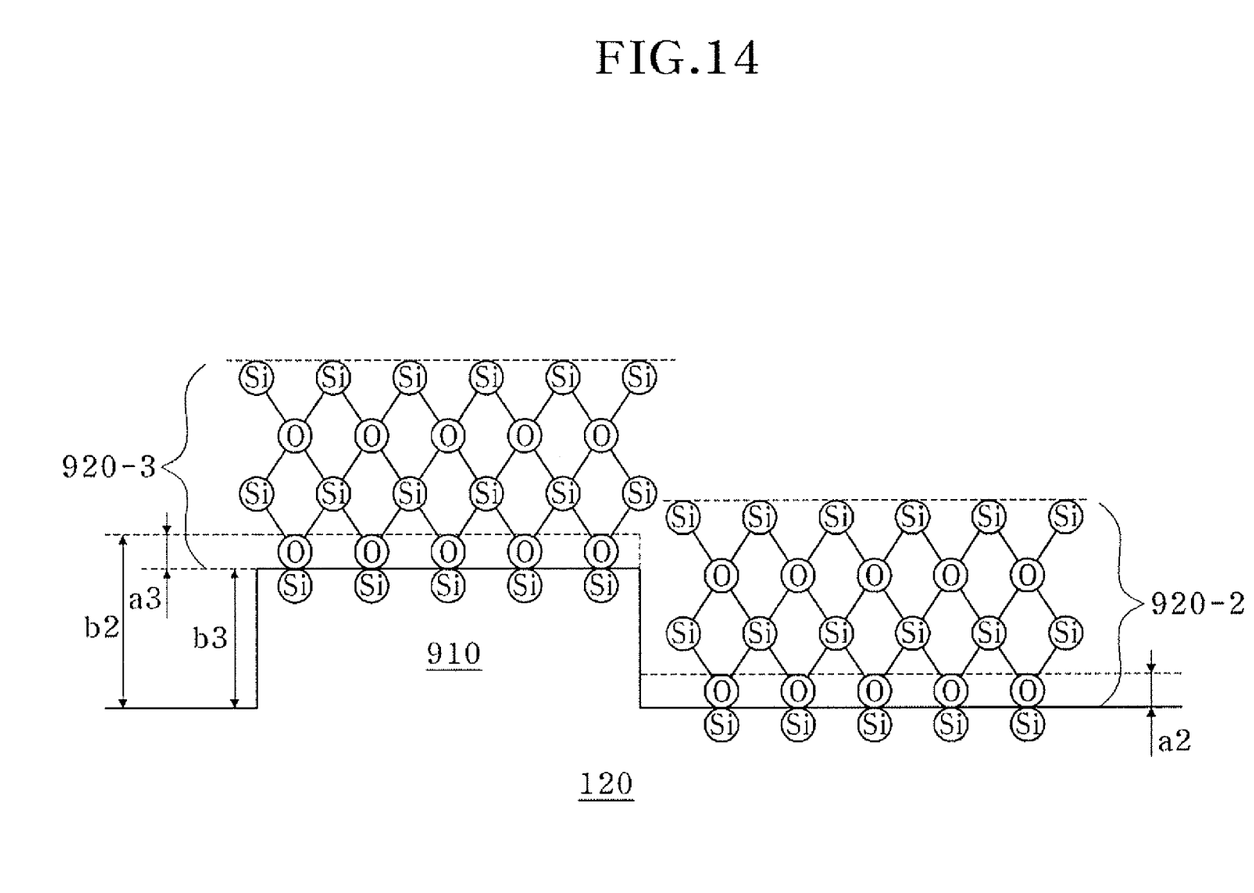

As illustrated in FIG. 14, a natural oxide film is re-formed on the surface of the defect 910 where the first natural oxide film 920-1 is removed. For convenience, the re-formed natural oxide film is referred to as a third natural oxide film 920-3. As the third natural oxide film 920-3 is formed, the defect 910 has a thickness b3 which is reduced by the oxidized thickness a3 from the previous thickness b2. In such a state, the third natural oxide film 920-3 is removed by performing the processes described above with reference to FIGS. 12 and 13. As the third natural oxide film 920-3 is removed, a natural oxide film is re-formed on the surface of the defect 910. Due to the re-formed natural oxide film, the defect 910 has a reduced thickness b3. In this manner, the defect 910 can be completely removed from the capping layer 120 by repeating the above-described process of removing the natural oxide film.

According to the embodiments of the present invention, the defect is removed by using the bond between the monomolecular film and the repair tip having a fine curvature diameter. Thus, the defect on the capping layer can be removed in fine units, without causing another defect on the capping layer which protects the multilayer reflection film of the EUV mask.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method of correcting a defect in an extreme ultraviolet (EUV) mask, the method comprising:
   preparing a repair tip by bonding a monomolecular film onto a surface of a repair tip;
   positioning the repair tip over a defect on an EUV mask so that the monomolecular film bonded onto the repair tip is also bonded to the defect; and
   moving the repair tip away from the EUV mask, so that the defect is separated from the EUV mask.

2. The method of claim 1, wherein the repair tip comprises an atomic force microscope (AFM) tip.

3. The method of claim 1, wherein an end portion of the repair tip has a curvature diameter of approximately 30 nm or less.

4. The method of claim 3, wherein the end portion of the repair tip has the curvature diameter of approximately 20 nm.

5. The method of claim 1, wherein the repair tip is made of silicon (Si).

6. The method of claim 1, wherein the preparing step comprises:
   forming an oxide film on the surface of the repair tip; and
   immersing the repair tip having the formed oxide film thereon into a solution containing a monomolecule for a predetermined time.

7. The method of claim 6, wherein the monomolecule includes a silane-based monomolecule having at least one carbon-silicon bond structure.

8. The method of claim 7, wherein the silane-based monomolecule has a first functional group and a second functional group both of which are bonded to a silicon atom, the first functional group bonding to the surface of the repair tip and the second functional group bonding to the defect.

9. The method of claim 8, wherein the second functional group comprises methoxy ($OCH_3$).

10. The method of claim 1, wherein the defect on the EUV mask is a residual material that remains on a surface of a capping layer after an etching process is performed to form a buffer pattern.

11. The method of claim 10, wherein the defect of the residual material comprises a silicon oxide residual material defect.

12. The method of claim 11, wherein bonding of the defect to the monomolecular film bonded onto the repair tip comprises bonding silicon of the silicon oxide residual material defect to oxygen of the monomolecular film bonded onto the repair tip.

13. The method of claim 1, wherein the defect on the EUV mask comprises a protrusion which abnormally protrudes from a surface of a capping layer.

14. The method of claim 13, wherein the capping layer is made of silicon.

15. The method of claim 14, wherein bonding of the defect to the monomolecular film bonded to the repair tip comprises bonding oxygen of the monomolecular film bonded onto the repair tip to silicon of a natural oxide film formed on the protrusion.

16. The method of claim 1, wherein, when the defect remains after the process of separating the defect from the EUV mask, the defect bonded with the repair tip is removed, and the defect removal process is repeated.

17. In an EUV mask where a multilayer reflection film, a capping layer, a buffer pattern, and an absorption pattern are stacked on a substrate, a method of correcting a defect in the EUV mask to remove a buffer pattern residual material disposed on the capping layer, the method comprising:

preparing a repair tip by bonding a monomolecular film onto a surface of the repair tip;

positioning the repair tip over the buffer pattern residual material disposed on the EUV mask, to bond the monomolecular film already bonded to the repair tip to also be bonded to the buffer pattern residual material; and moving the repair tip away from the EUV mask to separate the buffer pattern residual material away from the EUV mask.

18. The method of claim 17, wherein the repair tip is made of silicon;

the monomolecular film comprises a silane-based monomolecule having at least one carbon-silicon bond structure; and the buffer pattern residual material comprises a silicon oxide film.

19. In an EUV mask where a multilayer reflection film, a capping layer, a buffer pattern, and an absorption pattern are stacked on a substrate, a method of correcting a defect in the EUV mask to remove a protrusion formed on the capping layer, the method comprising:

preparing a repair tip by bonding a monomolecular film onto a surface of the repair tip;

performing a first process of positioning the repair tip over a defect disposed on the EUV mask so that the monomolecular film bonded to the repair tip is also bonded to a natural oxide film disposed on the protrusion;

performing a second process of moving the repair tip away from the EUV mask so that the natural oxide film is physically separated away from the EUV mask;

removing the separated natural oxide film which is bonded to the repair tip from the repair tip; and repeating the first and second processes so that substantially all of the protrusion is removed.

20. The method of claim 19, further comprising forming the natural oxide film by exposing the protrusion to the atmosphere after the second process.

21. The method of claim 19, wherein the repair tip is made of silicon;

the monomolecular film comprises a silane-based monomolecule having at least one carbon-silicon bond structure; and the protrusion of the capping layer is made of silicon.

\* \* \* \* \*